(12) United States Patent
Park et al.

(10) Patent No.: US 6,970,027 B2
(45) Date of Patent: Nov. 29, 2005

(54) APPARATUS FOR GENERATING CLOCK SIGNAL IN OPTICAL DISK AND METHOD THEREOF

(75) Inventors: Hyun-soo Park, Seoul (KR); Jae-jin Lee, Seoul (KR); You-pyo Hong, Seoul (KR); Jae-seong Shim, Seoul (KR); Ju-han Bae, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/765,183

(22) Filed: Jan. 28, 2004

(65) Prior Publication Data

US 2004/0227548 A1    Nov. 18, 2004

(30) Foreign Application Priority Data

May 14, 2003   (KR) ...................... 10-2003-0030505

(51) Int. Cl.[7] ................................................ H03L 7/06
(52) U.S. Cl. ..................... 327/156; 327/159; 331/11; 331/38
(58) Field of Search ................................ 327/156, 159, 327/141; 331/10, 11, 17, 38, 42

(56) References Cited

U.S. PATENT DOCUMENTS

| 4,720,687 A | * | 1/1988 | Ostoich et al. ............. 331/1 A |
| 5,446,416 A | * | 8/1995 | Lin et al. ....................... 331/11 |
| 5,751,675 A | * | 5/1998 | Tsutsui et al. ............ 369/44.27 |
| 6,404,291 B1 | * | 6/2002 | Riley ........................... 331/11 |
| 6,643,346 B1 | * | 11/2003 | Pedrotti et al. .............. 375/375 |

* cited by examiner

Primary Examiner—Terry D. Cunningham
Assistant Examiner—An T. Luu
(74) Attorney, Agent, or Firm—Stein, McEwen & Bui,LLP

(57) ABSTRACT

A clock generator for reproducing data recorded onto an optical disk, and more particularly, an apparatus for stably generating a clock signal synchronized with an input signal and a method of generating a clock signal. The apparatus generating a clock signal includes a voltage controlled oscillator, a phase compensator, a frequency compensator, and an adder. The voltage controlled oscillator generates a clock signal of a frequency that varies with a control voltage signal. The phase compensator receives an input signal and the clock signal, detects a phase difference between the input signal and the clock signal, and generates a first control voltage corresponding to the phase difference. The frequency compensator receives the input signal and the clock signal, detects a frequency difference between the input signal and the clock signal, and generates a second control voltage corresponding to the frequency difference. The adder sums the first control voltage and the second control voltage and generates the control voltage signal.

25 Claims, 4 Drawing Sheets

APPARATUS FOR GENERATING CLOCK SIGNAL IN OPTICAL DISK AND METHOD THEREOF

CROSS-REFERENCE TO RELATED APPLICATIONS

This application claims the priority of Korean Patent Application No. 2003-30505, filed on May 14, 2003 in the Korean Intellectual Property Office, the disclosure of which is hereby incorporated by reference in its entirety.

BACKGROUND OF THE INVENTION

1. Field of the Invention

The present invention relates to clock signal generation for reproducing data recorded onto an optical disk, and more particularly, to an apparatus for stably generating a clock signal that is synchronized with an input signal and a method thereof.

2. Description of the Related Art

In general, binary data is recorded onto a surface of an optical disk such as a compact disc (CD) or a digital versatile disc (DVD). The recorded binary data can be reproduced by projecting light such as a laser beam onto the optical disk and reading an optical signal reflected off the optical disk. Since the binary data read from the optical disk is in the form of an analog signal, i.e., a radio frequency (RF) signal, it is necessary to convert the analog signal into a digital signal.

To restore data stored in the optical disk, an analog/digital converter (ADC) and a phase locked loop (PLL) circuit are needed. The PLL circuit synchronizes a system clock signal for restoring digital data with an input signal and outputs the synchronized system clock signal.

FIG. 1 is a block diagram of a general PLL circuit.

The PLL circuit includes a phase detector (PD) 110, a loop filter 120, and a voltage controlled oscillator (VCO) 130.

The PD 110 detects a phase difference between an input signal and a clock signal output from the VCO 130. The detected phase difference is input to the loop filter 120. The loop filter 120 accumulates the detected phase difference, converts the accumulated phase difference into a voltage, and outputs the voltage to the VCO 130. The VCO 130 receives a control voltage signal and generates a clock signal.

FIG. 2 is a block diagram of a general PLL circuit having an additional frequency detector (FD) 140.

In general, the frequency range that can be synchronized by the PLL circuit is limited due to characteristics of the loop filter 120. Actually, the frequency range that can be synchronized by the PLL circuit is remarkably small. When a frequency difference between the clock signal output from the VCO 130 and the input signal is large, the PLL circuit does not operate. Thus, the clock signal output from the VCO 130 cannot be synchronized with the input signal.

To solve such a problem, when the frequency difference between the clock signal and the input signal is large, a frequency detector (FD) 140 is used to match the frequency of the clock signal output from the VCO 130 to the frequency of the input signal, thereby operating the PLL circuit.

The FD 140 can have various configurations. The input signal includes a data signal and a sync signal. In general, the FD 140 is configured to detect an input frequency using a sync signal of a maximum period, included in the input signal. For example, in a case of an optical disk such as a DVD, a data signal of a maximum period of 14T (T denotes a unit period), included in a sync signal, is used to detect the input frequency. When the PLL circuit operates normally, the signal of 14T is detected. However, when a frequency of an oscillating clock signal of the VCO 130 increases or decreases, a signal whose period is smaller or larger than 14T is detected. Thus, the FD 140 detects a signal of the maximum period within a section of the input signal and detects the frequency difference between the detected signal and the input signal based on the difference between the period of the detected signal and the period of 14T.

FIGS. 3A and 3B illustrate a case where an error of an input signal exceeds binary data level.

When the amplitude of the input signal is more than 0 level, it is detected as 1. When the amplitude of the input signal is less than 0 level, it is detected as 0. Recently, as optical disks have increased their recording density, the qualities of reproduced signals are degraded. With degradation of the qualities of reproduced signals, the error of the input signal may exceed the binary level as shown in FIGS. 3A and 3B. In this case, the input signal is not accurately detected, which prevents a signal of the maximum period from being accurately detected. In other words, a section 310, illustrated in FIG. 3A, which is supposed to be detected as 1 in an original signal may be detected as 0 as shown in a section 320, illustrated in FIG. 3B in a distorted signal. As a result, the signal of the maximum period may not be accurately detected.

FIGS. 4A and 4B illustrate loss of input data when an oscillating frequency of the VCO 130 is lowered to ½T.

When the oscillating frequency changes sharply, the FD 140 may experience a malfunction. For example, when a signal of the minimum period among the input signal has a period of 2T, if the oscillating frequency is sharply lowered to below ½T, a signal of 2T may be detected as a signal of below 1T or even as a signal that does not reach 0 level. Thus, the probability of malfunction of the FD 140 that detects the frequency of the maximum period increases. In other words, as shown in FIG. 4B, a data loss section 410 may be generated.

SUMMARY OF THE INVENTION

The present invention provides an apparatus and a method for stably generating a clock signal by operating a frequency detector using symmetrical sync signals when an optical disk symmetrically outputs sync signals and by detecting frequencies even when an input signal is distorted due to noise therein and a frequency of an oscillating clock signal changes sharply.

According to one aspect of the present invention, there is provided an apparatus for generating a clock signal. The apparatus comprises a voltage controlled oscillator, a phase compensation unit, a frequency compensation unit, and an adder. The voltage controlled oscillator generates a clock signal of a frequency that varies with a control voltage signal. The phase compensation unit receives an input signal and the clock signal, detects a phase difference between the input signal and the clock signal, and generates a first control voltage corresponding to the phase difference. The frequency compensation unit receives the input signal and the clock signal, detects a frequency difference between the input signal and the clock signal, and generates a second control voltage corresponding to the frequency difference. The adder sums the first control voltage and the second control voltage and generates the control voltage signal.

The phase compensation unit comprises a phase detector and a loop filter. The phase detector receives an input signal and the clock signal and detects a phase difference between the input signal and the clock signal. The loop filter filters the output of the phase detector and outputs a voltage corresponding to the phase difference.

The frequency compensation unit further comprises a first maximum period detection unit, a second maximum period detection unit, a maximum period detecting unit, and a frequency error generating unit. The first maximum period detection unit counts the number of clock signals within each section where the input signal is positive (+) and outputs the maximum count value for a predetermined amount of time. The second maximum period detection unit counts the number of clock signals within each section where the input signal is negative (−) and outputs the maximum count value for a predetermined amount of time. The maximum period detecting unit receives a first maximum period and a second maximum period and determines whether the input signal has an error. The frequency error generating unit compares the output signal of the maximum period detecting unit with a predetermined value and generates a control voltage corresponding to the difference between the output signal and the predetermined value.

According to yet another aspect of the present invention, there is provided a frequency compensation apparatus comprising a first maximum period detecting unit, a second maximum period detection unit, a maximum period detecting unit, and a frequency error generating unit. The first maximum period detecting unit counts the number of clock signals within each section where the input signal is positive (+) and outputs the maximum count value for a predetermined amount of time. The second maximum period detection unit counts the number of clock signals within each section where the input signal is negative (−) and outputs the maximum count value for a predetermined amount of time. The maximum period detecting unit receives a first maximum period and a second maximum period and determines whether the input signal has an error. The frequency error generating unit compares the output signal of the maximum period detecting unit with a predetermined value and generates a control voltage corresponding to the difference between the output signal and the predetermined value.

According to yet another aspect of the present invention, there is provided a method of generating a clock signal. The method comprises generating a first clock signal of a frequency that varies with a control voltage signal, receiving an input signal and the first clock signal, detecting a phase difference between the input signal and the first clock signal, and outputting a first control voltage corresponding to the phase difference, receiving the input signal and the first clock signal, detecting a frequency difference between the input signal and the first clock signal, and outputting a second control voltage corresponding to the frequency difference, and controlling the frequency of the first clock signal based on a control voltage signal generated by adding the first control voltage and the second control voltage and generating a second clock signal.

According to yet another aspect of the present invention, there is provided a computer readable recording medium having embodied thereon a computer program for a method of generating a clock signal. The method comprises generating a first clock signal of a frequency that varies with a control voltage signal, receiving an input signal and the first clock signal, detecting a phase difference between the input signal and the first clock signal, and outputting a first control voltage corresponding to the phase difference, receiving the input signal and the first clock signal, detecting a frequency difference between the input signal and the first clock signal, and outputting a second control voltage corresponding to the frequency difference, and controlling the frequency of the first clock signal based on a control voltage signal generated by summing the first control voltage and the second control voltage and generating a second clock signal.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
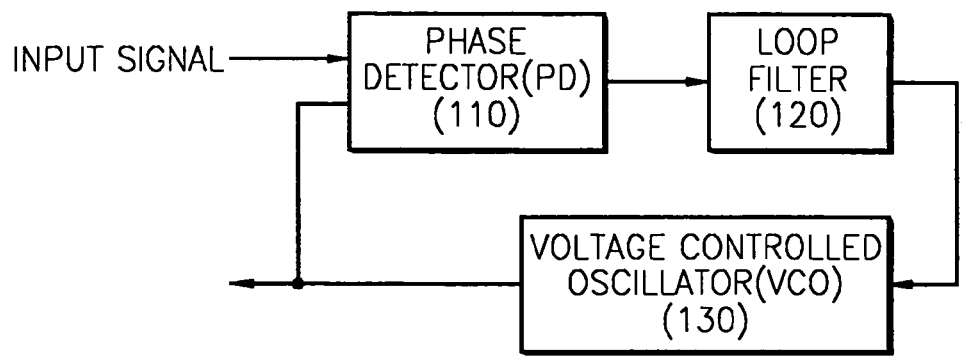
FIG. 1 is a block diagram of a general phase locked loop (PLL) circuit.
Figure 2:
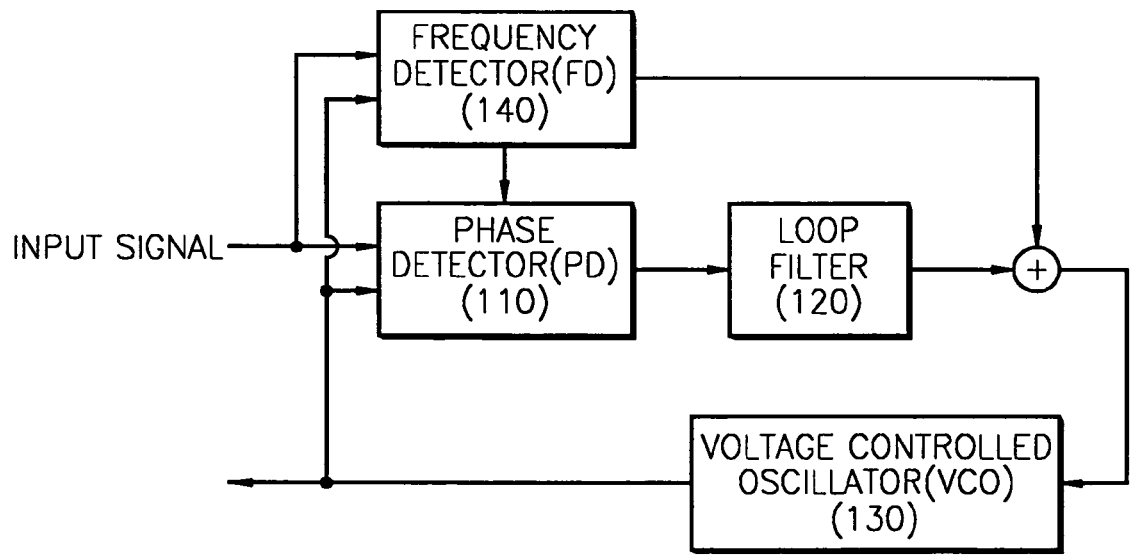
FIG. 2 is a block diagram of a general PLL circuit to which a frequency detector (FD) is added.
Figure 3A:
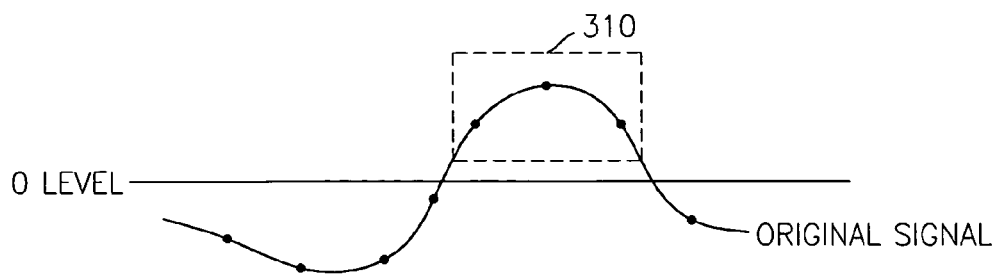
FIGS. 3A and 3B illustrate a case where an error of an input signal exceeds a binary data level.
Figure 3B:
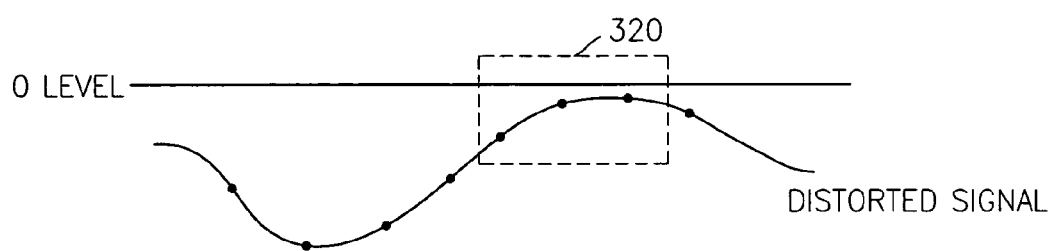
Figure 4A:
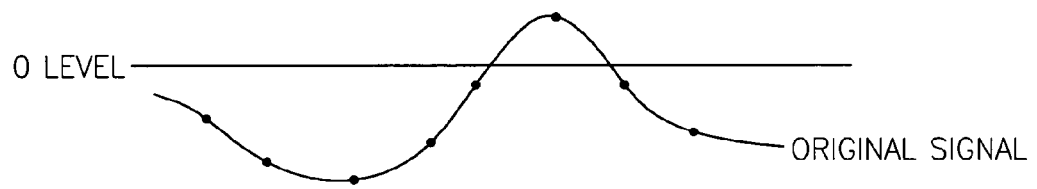
FIGS. 4A and 4B illustrate loss of input data when an oscillating frequency of a voltage controlled oscillator (VCO) is lowered to $\frac{1}{2}T$.
Figure 4B:
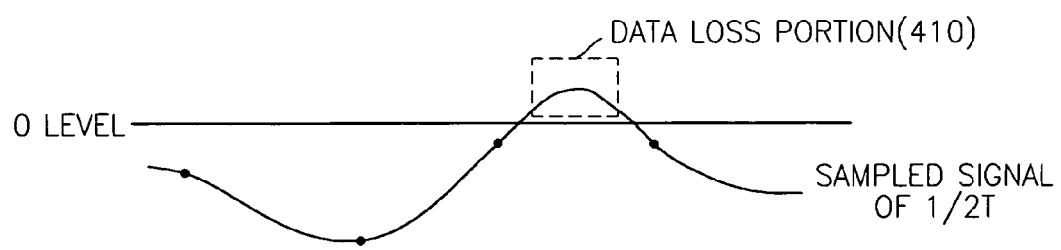

Reference will now be made in detail to the embodiments of the present invention, examples of which are illustrated in the accompanying drawings, wherein like reference numerals refer to the like elements throughout. The embodiments are described below to explain the present invention by referring to the figures.

The present invention will now be described more fully with reference to the accompanying drawings, in which a preferred embodiment of the invention is shown.

Figure 5:
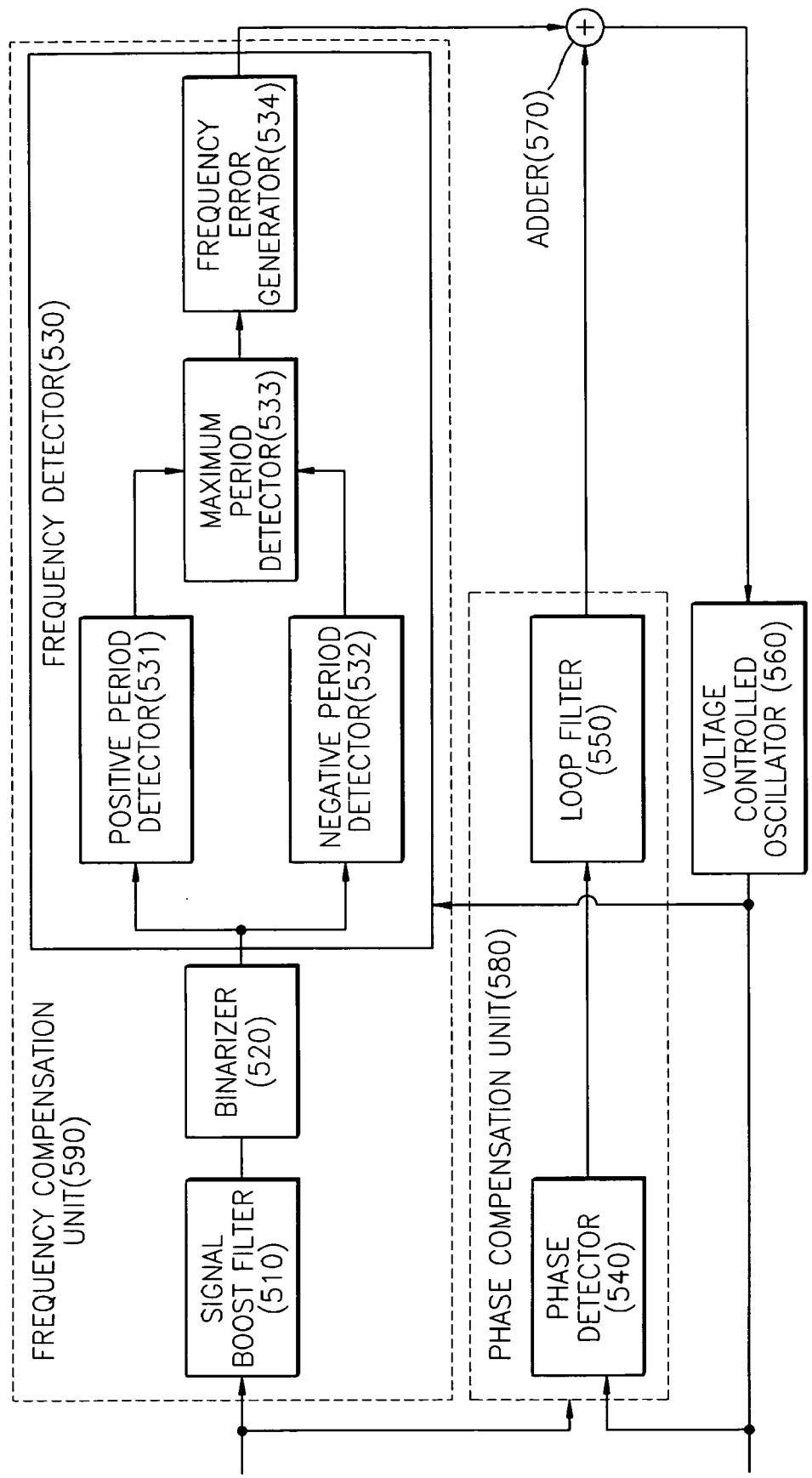
FIG. 5 is a block diagram of a PLL circuit according to an embodiment of the present invention.

FIG. 5 is a block diagram of a PLL circuit according to an embodiment of the present invention.

The PLL circuit includes a signal boost filter 510, a binarizer 520, a frequency detector 530, a phase detector 540, a loop filter 550, and a voltage controlled oscillator 560. The phase detector 540 and the loop filter 550 may be grouped as a phase compensation unit 580, and the signal boost filter 510, the binarizer 520, and the frequency detector 530, may be grouped as a frequency compensation unit 590.

A radio frequency (RF) signal read from an optical disk is input to the signal boost filter 510 and the phase detector 540. The signal boost filter 510 boosts a frequency of an input signal to improve efficiency of frequency detection. The signal boost filter 510 may have various configurations.

The signal boost filter 510 boosts the frequency of the input signal. In particular, the signal boost filter 510 boosts a high-frequency component of the input signal. The input signal has much noise for various reasons. In particular, there is much noise around a standard level used to determine whether the amplitude of the input signal is 0 or 1.Thus, if the high-frequency component that tends to sharply change is highly amplified, it is possible to prevent an error of data reproduction, caused by high-frequency noise around the standard level.

The phase detector 540 detects the phase difference between an oscillating clock signal output from the voltage controlled oscillator 560 and the input signal. The phase detector 540 outputs a phase error, and the phase error is input to the loop filter 550. The loop filter 550 filters the received phase error and converts the phase error into a control voltage for controlling a frequency of the oscillating clock signal.

The signal whose frequency is boosted by the signal boost filter 510 is converted into binary data by the binarizer 520. The PLL circuit of the present invention may be used for an analog input signal.

The output signal of the binarizer 520 is input to the frequency detector 530. The frequency detector 530 detects a signal of the maximum period, included in the input signal, and outputs the signal. The frequency detector 530 includes a positive maximum period detector 531, a negative maximum period detector 532, a maximum period detector 533, and a frequency error generator 534.

If the output signal of the binarizer 520 is, for example, "- - - 10000111101000001111110 - - - ", the positive maximum period detector 531 counts the number of consecutive 1s and outputs the maximum count value within a section of the input signal. If the above output signal is input, the positive maximum period detector 531 outputs the maximum count value 7. Similarly, the negative maximum period detector 532 counts the number of consecutive 0s and outputs the maximum count value within a section of the input signal. If the above output signal is input, the negative maximum period detector 532 outputs the maximum count value 5.

An analog signal may be directly input to the positive maximum period detector 531 and the negative maximum period detector 532 without being processed by the binarizer 520. In this case, the positive maximum period detector 531 detects the number of system clock signals within a section where the input signal is positive (+). Since the section where the input signal is positive (+) may occur several times within a predetermined amount of time, the number of system clock signals is counted within each section, respectively. Then, the maximum count value is output. Similarly, the negative maximum period detector 532 counts the number of system clock signals within a section where the input signal is negative (−). Since the section where the input signal is negative (−) may occur several times within a predetermined amount of time, the number of system clock signals is counted within each section, respectively. Then, the maximum count value is output. The positive maximum period detector 531 and the negative maximum period detector 532 have the same function except that they detect the maximum count values for different codes of input signals.

A positive maximum period and a negative maximum period, detected in this way, are input to the maximum period detector 533. The maximum period detector 533 compares the positive maximum period received from the positive maximum period detector 531 and the negative maximum period received from the negative maximum period detector 532, and determines whether the input signal has an error by calculating and outputting the maximum period.

Hereinafter, a method of determining whether the input signal has an error will be described. In an aspect of the invention, after a predetermined amount of time has passed, the received positive maximum period and the received negative maximum period are compared. When the difference between the received positive maximum period and the received negative maximum period is less than a predetermined range, it is determined that both the positive maximum period and the negative maximum period are valid. Thus, one of them or an average value thereof is output. If the predetermined amount of time is set small, a sync signal may not be input during the predetermined amount of time. On the other hand, if the predetermined amount of time is set large, performance of the PLL circuit may be degraded. If the predetermined range is set small, the PLL circuit can be more finely controlled. In contrast, if the predetermined range is set large, an error of the maximum period detector 533 increases.

In another aspect, when the positive maximum period and the negative maximum period are updated, a signal of next zero crossing, i.e., a signal of reaching zero level is additionally input. Then, the number of system clock signals is counted within a section where the input signal is positive (+) or negative (−). The count value is compared with the previously detected maximum period. If the difference between the count value and the previously detected maximum period is below a predetermined value, one of them or an average value thereof is output.

Both aspects can be used when sync signals of the maximum periods are input symmetrically. The maximum period detected in this way is input to the frequency error generator 534. The frequency error generator 534 compares the received maximum period with a period of 14T that is a period of a sync signal of a DVD and outputs the difference between the received maximum period and the period of 14T. Then, a voltage corresponding to the difference is output.

The outputs of the frequency detector 530 and the loop filter 550 are added by an adder 570. The frequency detector 530 outputs a voltage corresponding to a frequency error, and the loop filter 550 outputs a voltage corresponding to a phase error. Thus, if two voltages are summed and the sum is output to the voltage controlled oscillator 560, an oscillating clock signal of a desired frequency can be obtained. The voltage controlled oscillator 560 receives a control voltage and generates a clock signal of a frequency corresponding to the control voltage.

Figure 6:
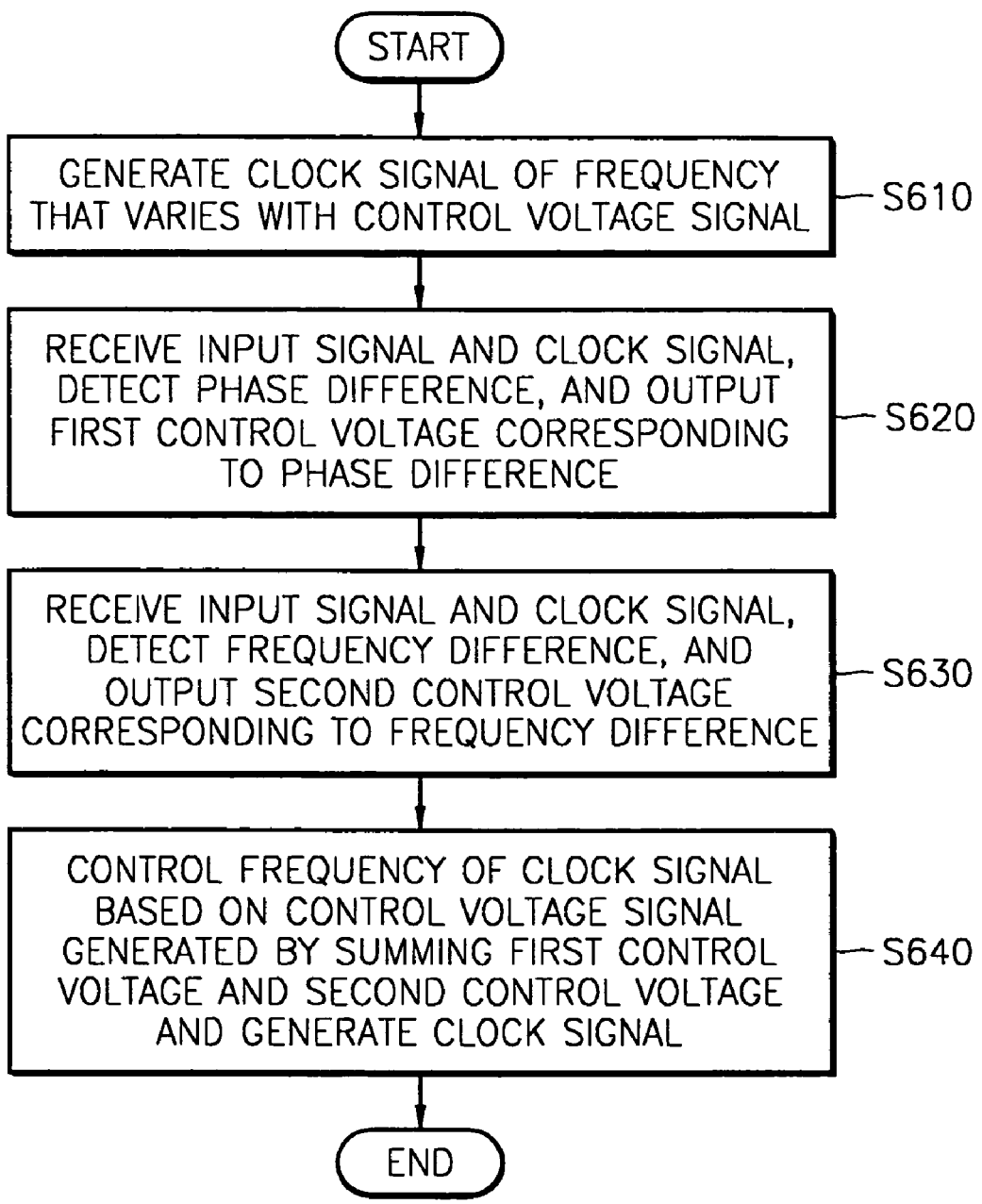
FIG. 6 is a flowchart describing a method of generating a clock signal, according to an embodiment of the present invention.

FIG. 6 is a flowchart describing a method of generating a clock signal, according to the present invention.

First, a clock signal of a frequency that varies with a control voltage signal (operation S610) is generated. Then, an input signal and the clock signal are received, a phase difference between the input signal and the clock signal is detected, and a first control voltage corresponding to the phase difference is output (operation S620). Also, the input signal and the clock signal are received, a frequency difference between the input signal and the clock signal is detected, and a second control voltage corresponding to the frequency difference is output (operation S630).

The frequency of the clock signal is controlled based on a control voltage signal generated by summing the first control voltage and the second control voltage, and a clock signal is generated (operation S640).

The present invention may be embodied as a computer readable code in a computer readable recording medium. The computer readable recording medium may be a recording device in which data that is readable by a computer system is stored. The computer readable recording medium includes, but is not limited to, ROM, RAM, CD-ROM, magnetic tapes, hard disks, floppy disks, flash memory, optical data storage media, and carrier waves (e.g., transmissions over the Internet). In addition, the computer readable recording medium may be distributed over the computer system connected via a network, and stored and implemented as a computer readable code using a distribution technique.

As described above, an apparatus for generating a clock signal and a method thereof, according to the present invention, can deliver the following effects.

First, when the quality of a reproduced signal is not good, it is possible to stably detect a frequency error. Second, when the frequency difference between the input signal and the oscillating clock signal is significantly different, the frequency error can be stably detected. Third, by stably detecting the frequency error, stability of the PLL circuit can be improved. Fourth, with improvement in stability of the PLL circuit, performance of an optical disk reproducing apparatus is improved. Therefore, a reliable optical disk reproducing apparatus can be obtained.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An apparatus generating a clock signal, the apparatus comprising:
    a voltage controlled oscillator which generates a clock signal of a frequency that varies with a control voltage signal;
    a phase compensator which receives an input signal and the clock signal, detects a phase difference between the input signal and the clock signal, and generates a first control voltage corresponding to the phase difference;
    a frequency compensator which receives the input signal and the clock signal, detects a frequency difference between the input signal and the clock signal, and generates a second control voltage corresponding to the frequency difference; and
    an adder which sums the first control voltage and the second control voltage and generates the control voltage signal, wherein the frequency compensator comprises a booster which boosts a high-frequency component of the input signal.

2. The apparatus of claim 1, wherein the input signal is a radio frequency (RF) signal read from data recorded onto an optical disk.

3. The apparatus of claim 1, wherein the phase compensator comprises:
    a phase detector which receives the input signal and the clock signal and detects a phase difference between the input signal and the clock signal; and
    a loop filter which filters an output of the phase detector and outputs the first control voltage corresponding to the phase difference.

4. The apparatus of claim 1, wherein the frequency compensator comprises a binarizer which converts the input signal into a digital signal.

5. The apparatus of claim 1, wherein the frequency compensator further comprises:
    a first maximum period detector which counts the number of clock signals within each section where the input signal is positive (+) and outputs a first maximum period for a predetermined amount of time;
    a second maximum period detector which counts the number of clock signals within each section where the input signal is negative (−) and outputs a second maximum period for the predetermined amount of time;
    a maximum period detector which receives the first maximum period and the second maximum period and determines whether the input signal has an error; and
    a frequency error generator which compares the output signal of the maximum period detector with a predetermined value and generates a control voltage corresponding to the difference between the output signal and the predetermined value.

6. The apparatus of claim 5, wherein the predetermined value is a period of 14T of a sync signal of a digital versatile disk (DVD).

7. The apparatus of claim 5, wherein when the difference between the first maximum period and the second maximum period is less than a predetermined range, the maximum period detector outputs either the first maximum period or the second maximum period or an average value of the first maximum period and the second maximum period.

8. The apparatus of claim 5, wherein the maximum period detector additionally receives a signal of a period of T, counts the number of clock signals within each section where the signal is positive (+) or negative (−), compares the count value with the first maximum period or the second maximum period, and outputs one of the count values, the first maximum period, or the second maximum period or an average value of the count value and the first maximum period or an average value of the count value and the second maximum period.

9. A frequency compensation apparatus comprising:
    a first maximum period detector which counts a number of clock signals within each section where an input signal is positive (+) and outputs a first maximum period for a predetermined amount of time;
    a second maximum period detector which counts the number of clock signals within each section where the input signal is negative (−) and outputs a second maximum period for the predetermined amount of time;
    a maximum period detector which receives a first maximum period and a second maximum period and determines whether the input signal has an error; and
    a frequency error generator which compares an output signal of the maximum period detector with a predetermined value and generates a control voltage corresponding to a difference between the output signal and the predetermined value.

10. The frequency compensation apparatus of claim 9, wherein when a difference between the first maximum period and the second maximum period is less than a predetermined range, the maximum period detector outputs either the first maximum period or the second maximum period or an average value of the first maximum period and the second maximum period.

11. The frequency compensation apparatus of claim 9, wherein the maximum period detector additionally receives a signal of a period of T, counts the number of clock signals within each section where the signal is positive (+) or negative (−), compares a count value with the first maximum period or the second maximum period, and outputs one of the count value, the first maximum period, or the second maximum period or an average value of the count value and the first maximum period or an average value of the count value and the second maximum period.

12. A method of generating a clock signal, the method comprising:
    generating a first clock signal of a frequency that varies with a control voltage signal;

receiving an input signal and the first clock signal, detecting a phase difference between the input signal and the first clock signal, and outputting a first control voltage corresponding to the phase difference;

receiving the input signal and the first clock signal, detecting a frequency difference between the input signal and the first clock signal, and outputting a second control voltage corresponding to the frequency difference; and controlling the frequency of the first clock signal based on the control voltage signal generated by summing the first control voltage and the second control voltage and generating a second clock signal, wherein the outputting of the second control voltage corresponding to the frequency difference comprises receiving the clock signal and a signal generated by boosting a high-frequency component of the input signal, detecting a frequency difference between the clock signal and the signal, and outputting the second control voltage corresponding to the frequency difference.

13. The method of claim 12, wherein the input signal is a radio frequency (RF) signal read from data recorded onto an optical disk.

14. The method of claim 12, wherein the outputting of the first control voltage corresponding to the phase difference comprises:

receiving the input signal and the first clock signal and detecting the phase difference between the input signal and the first clock signal; and filtering the output of the phase detector and outputting the first control voltage corresponding to the phase difference.

15. The method of claim 12, wherein the outputting of the second control voltage corresponding to the frequency difference comprises:

counting a number of clock signals within each section where the input signal is positive (+) and outputting a first maximum count value for a predetermined amount of time;

counting a number of clock signals within each section where the input signal is negative (−) and outputting a second maximum count value for a predetermined amount of time;

receiving, a first maximum period and a second maximum period and determining whether the input signal has an error; and comparing an output signal of the maximum period detecting unit with a predetermined value and generating a control voltage corresponding to the difference between the output signal and the predetermined value.

16. The method of claim 15, wherein the predetermined value is a period of 14T of a sync signal of a digital versatile disk (DVD).

17. The method of claim 15, wherein when the difference between the first maximum period and the second maximum period is less than a predetermined range, outputting either the first maximum period or the second maximum period or an average value of the first maximum period and the second maximum period.

18. The method of claim 15, wherein in addition to receiving, a first maximum period and a second maximum period and determining whether the input signal has an error, receiving a signal of a period of T, counting the number of clock signals within each section where the signal is positive (+) or negative (−), comparing the count value with the first maximum period or the second maximum period, and outputting one of the count value, the first maximum period, or the second maximum period or an average value of the count value and the first maximum period or an average value of the count value and the second maximum period if the difference between the count value and the first maximum period or the second maximum period is less than the predetermined value.

19. A frequency compensation method comprising:

counting a number of clock signals within each section where an input signal is positive (+) or negative (−) and outputting a maximum positive count value and a maximum negative count value;

comparing the maximum positive count value with the maximum negative count value; and if the difference between the maximum positive count value and the maximum negative count value is below a predetermined value, outputting either the maximum positive count value or the maximum negative count value or an average value of the maximum positive count value and the maximum negative count value.

20. A computer readable recording medium having embodied thereon a computer program for a method of generating a clock signal, wherein the method comprises:

generating a first clock signal of a frequency that varies with a control voltage signal;

receiving an input signal and the first clock signal, detecting a phase difference between the input signal and the first clock signal, and outputting a first control voltage corresponding to the phase difference;

receiving the input signal and the first clock signal, detecting a frequency difference between the input signal and the first clock signal, and outputting a second control voltage corresponding to the frequency difference; and controlling the frequency of the first clock signal based on the control voltage signal generated by summing the first control voltage and the second control voltage and generating a second clock signal, wherein the outputting of the second control voltage corresponding to the freguency difference comprises receiving the clock signal and a signal generated by boosting a high-freguency component of the input signal, detecting a frequency difference between the clock signal and the signal, and outputting the second control voltage corresponding to the freguency difference.

21. The computer readable recording medium according to claim 20, wherein the computer program is stored in a magnetic tape, a hard disk, a floppy disk, a flash memory, an optical storage media or a carrier wave.

22. The computer readable recording medium according to claim 20, wherein the computer program is distributed over a computer system connected via a network, and the computer program is stored and implemented as a computer readable code using a distribution technique.

23. A computer readable recording medium having embodied thereon a computer program for a frequency compensation method, wherein the frequency compensation method comprises:

counting a number of clock signals within each section where the signal is positive (+) or negative (−), and outputting a maximum positive count value and a maximum negative count value;

comparing the maximum positive count value with the maximum negative count value; and if the difference between the maximum positive count value and the maximum negative count value is below a predetermined value, outputting either the maximum positive count value or the maximum negative count value or an average value of the maximum positive count value and the maximum negative count value.

24. The computer readable recording medium according to claim 23, wherein the computer program is stored in a magnetic tape, a hard disk, a floppy disk, a flash memory, an optical storage media or a carrier wave.

25. The computer readable recording medium according to claim 23, wherein the computer program is distributed over a computer system connected via a network, and the computer program is stored and implemented as a computer readable code using a distribution technique.

* * * * *